(12) United States Patent
Ikeda et al.

(10) Patent No.: US 6,559,449 B2
(45) Date of Patent: May 6, 2003

(54) PLANAR X-RAY DETECTOR

(75) Inventors: Mitsushi Ikeda, Yokohama (JP);
Masaki Atsuta, Yokohama (JP);
Katsuyuki Naito, Tokyo (JP); Akira Kinno, Yokohama (JP); Hitoshi Yagi, Yokohama (JP); Manabu Tanaka, Nasu-gun (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/817,150

(22) Filed: Mar. 27, 2001

(65) Prior Publication Data

US 2002/0036267 A1 Mar. 28, 2002

(30) Foreign Application Priority Data

Mar. 28, 2000 (JP) ......................................... 2000-087814

(51) Int. Cl.⁷ ............................... G21K 4/00; G01T 1/20
(52) U.S. Cl. .............................. 250/361 R; 250/370.09; 250/370.11
(58) Field of Search ........................ 250/370.09, 370.11, 250/361 R (56) References Cited

U.S. PATENT DOCUMENTS

| 5,646,412 A | * | 7/1997 | Bryan et al. ............. 250/483.1 |
| 5,729,021 A | * | 3/1998 | Brauers et al. ........ 250/370.09 |
| 5,886,359 A | * | 3/1999 | Bringley et al. ....... 250/370.09 |

FOREIGN PATENT DOCUMENTS

| JP | 58-113897 | 7/1983 |
| JP | 7-209430 | 8/1995 |

* cited by examiner

*Primary Examiner*—Constantine Hannaher
(74) *Attorney, Agent, or Firm*—Oblon, Spivak, McClelland, Maier & Neustadt, P.C.

(57) ABSTRACT

A planar X-ray detector including an X-ray-electric charge conversion film converting an incident X-ray into an electric charge, a pixel electrode contiguous to the X-ray-electric charge conversion film and arranged for every pixel, and a switching element connected to the pixel electrode. Also included is a signal line connected to the switching element, and a scanning line supplying a driving signal to the switching element. Further, the X-ray-electric charge conversion film contains phosphor particles, a photosensitive material, and a carrier transfer material.

22 Claims, 5 Drawing Sheets

PLANAR X-RAY DETECTOR

BACKGROUND OF THE INVENTION

The present invention relates to a flat panel X-ray detector.

In recent years, preparation of data base on the medical data on a patient is being promoted in a medical field in order to perform the medical treatment promptly and appropriately. It should be noted in this connection that the patient utilizes in general a plurality of medical organizations. Therefore, if there is no data prepared in another medical organization, there is possibility that an appropriate medical treatment is not performed.

The data base preparation is also required in respect of the image data of the X-ray photography, and it is hoped from this point that a digital system be developed in respect of the X-ray photograph. It was customary in the past to use a silver halide film in the medical X-ray diagnostic apparatus. For employing a digital system in the medical X-ray diagnostic apparatus, it was necessary to develop the photograph film image and scan again the developed film image with a scanner, which was laborious and time-consuming.

In recent years, a system of directly converting the image into digital data has been realized by using the CCD camera sized about one inch. However, in photographing, for example, a lung, a region of about 40 cm×40 cm is photographed, making it necessary to use an optical apparatus for collecting light, leading to the problem that the apparatus is rendered bulky.

Figure 1:
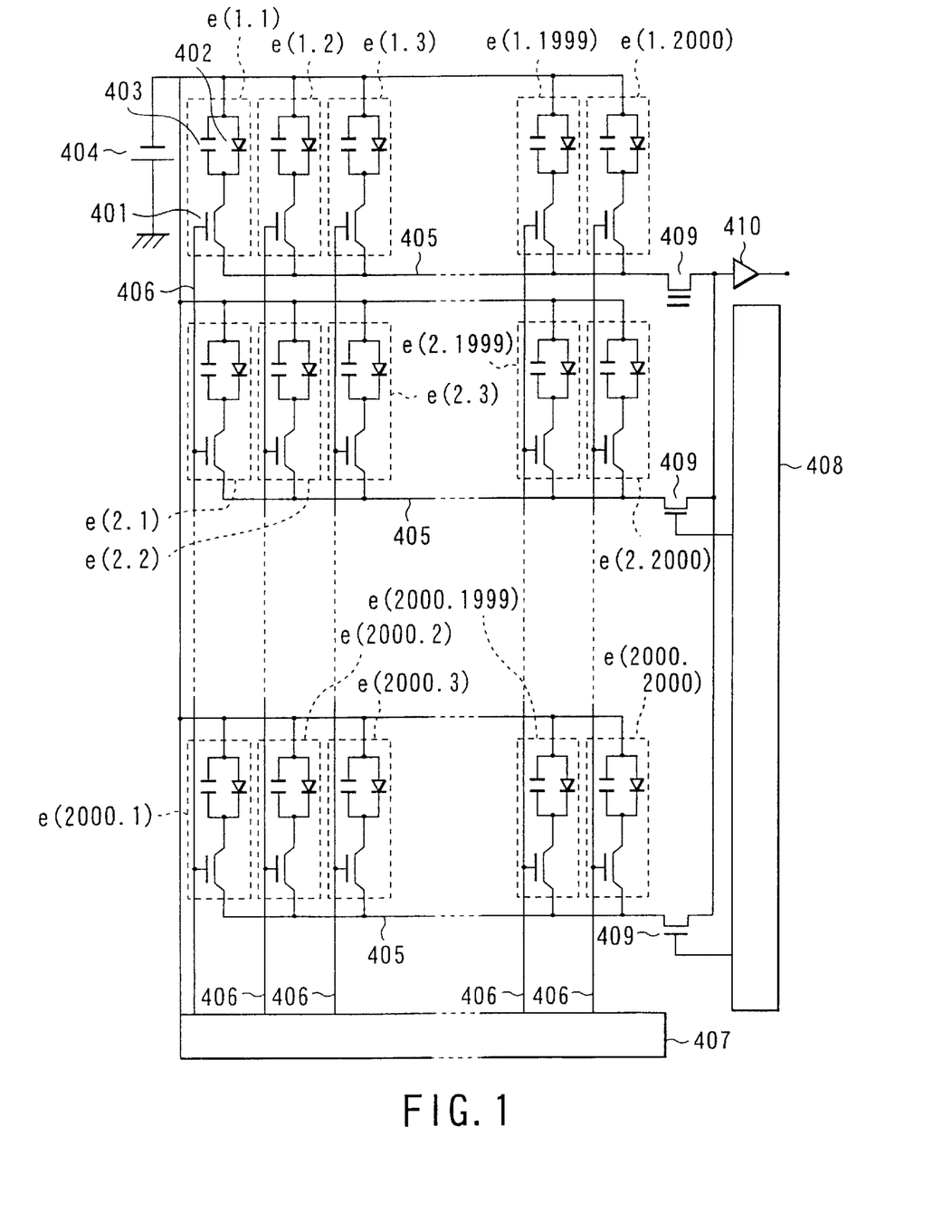
FIG. 1 is a circuit diagram of a flat panel X-ray detector.

As a system for overcoming the above-noted problems inherent in the two systems described above, proposed is a flat panel X-ray detector of an indirect conversion system using an amorphous silicon thin film transistor (a-Si TFT). FIG. 1 shows the circuit construction of the flat panel X-ray detector. The operation of the flat panel X-ray detector will now be described with reference to FIG. 1.

The flat panel X-ray detector shown in FIG. 1 is a flat panel X-ray detector of an indirect conversion type, in which an incident X-ray is converted into a visible light by, for example, a phosphor, and the converted visible light is further converted into an electric charge for each pixel by a photo-conduction film.

As shown in FIG. 1, the flat panel X-ray detector comprises pixels e (i, j) (i=1 to 2000, j=1 to 2000). Each pixel e comprises a switching TFT 401 formed of a-Si, a photo-conduction film 402 and a Cst 403. These pixels e are arranged to form an array, the row of the array consisting of hundreds of to thousands of pixels e and the column of the array also consisting of hundreds of to thousands of pixels. A negative bias voltage is applied from a power source 404 to the photo-conduction film 402. The switching TFT 401 is connected to a signal line 405 and to a scanning line 406 and is subjected to an on-off control by a scanning line driving circuit 407. The terminal of the signal line 405 is connected to an amplifier 410 for the signal detection via a change-over switch 409 that is controlled by a signal line control circuit 408.

If an X-ray is incident, the phosphor (not shown) irradiated with the X-ray emits a fluorescent light. The fluorescent light is then converted into an electric charge by the photo-conduction film 402, and the electric charge is accumulated in the Cst 403. If a scanning line 406 is driven by the scanning line driving circuit 407 so as to turn on a column of switching TFTs 401 connected to one of the scanning lines 406, the accumulated charge is transferred through the signal line 405 toward the amplifier 410. By the change-over switch 409, the charge is supplied to the amplifier 410 for each pixel so as to be converted into a dot sequential signal.

The amount of the electric charge differs depending on the amount of light incident on the pixels (i, j) so as to change the output amplitude of the amplifier 410. By subjecting the output signal of the amplifier 410 to an A/D conversion, the electric charge can be converted directly into a digital image. Further, the pixel region can be made thin and large by utilizing the array of the switching TFTs 401.

Figure 2:
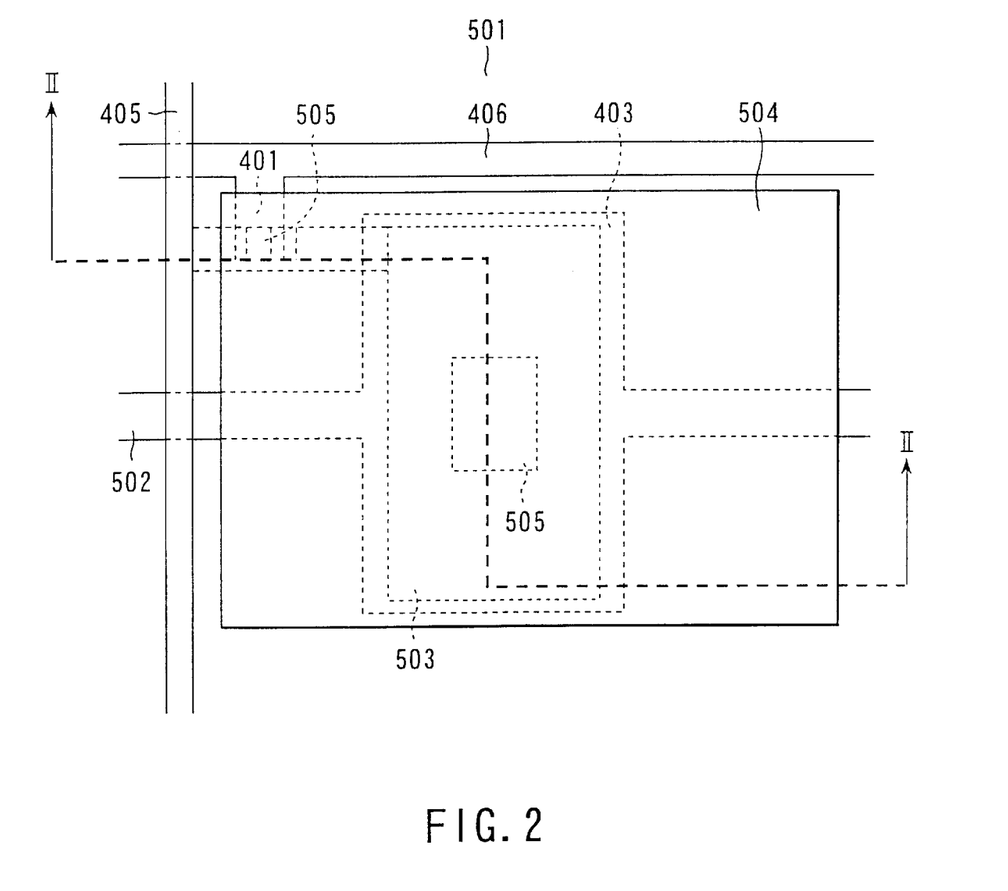
FIG. 2 is a plan view showing a pixel included in the flat panel X-ray detector shown in FIG. 1.

FIG. 2 is a plan view showing the construction of the pixel 501 included in the flat panel X-ray detector. As shown in the drawing, the pixel 501 comprises a switching TFT 401 for the reading, a Cst 403, a Cst line 502 connected to the Cst 403, an auxiliary electrode 503 facing the Cst 403, a pixel electrode 504, a signal line 405, and a scanning line 406. A contact portion 505 is formed in each of the switching TFT 401 and the auxiliary electrode 503.

It should be noted that the layers above the pixel electrode 504 and the region outside the pixel 501 are omitted from the drawing of FIG. 2. Incidentally, it is possible to utilize the floating capacitance of the other elements and the wiring in place of arranging the Cst 403.

Figure 3:
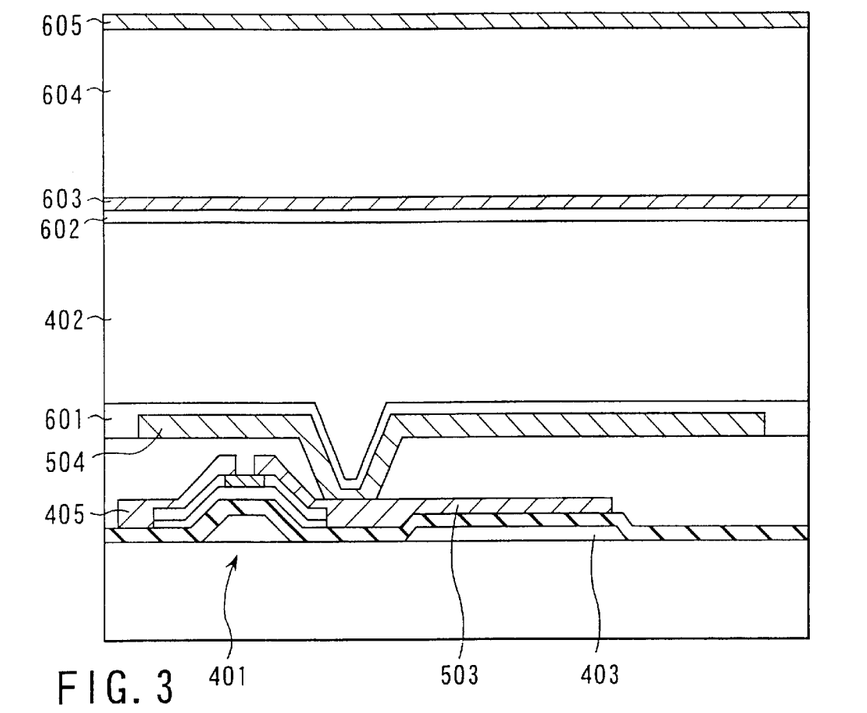
FIG. 3 is cross sectional view showing the pixel of the conventional flat panel X-ray detector along the line II—II shown in FIG. 2.

FIG. 3 is a cross sectional view along the line II—II shown in FIG. 2, which shows the constructions of the layers formed above the pixel electrode 504.

As shown in FIG. 3, a pixel electrode 504, a p-type contact film 601, a photo-conduction film 402, an n-type contact film 602, a common electrode 603, a phosphor layer 604 and a reflective layer 605 are laminated in the order mentioned on the structure including the switching TFT 401, the Cst 403, the auxiliary electrode 503, the signal line 405 and the scanning line (not shown).

If an X-ray is incident on the phosphor layer 604 through the reflective layer 605, a fluorescent light is emitted from the phosphor layer 604 irradiated with the X-ray, and the fluorescent light thus emitted is scattered. The fluorescent light then enters the photo-conduction film 402 directly or is reflected from the reflective layer 605 and, then, the reflected fluorescent light enters the photo-conduction film 402. In the photo-conduction film 402, the fluorescent light is converted into an electric charge. It should be noted that, since voltage is applied across the photo-conduction film 402, the generated electric charge is attracted by the pixel electrode 504 for each pixel 501 so as to be accumulated in the Cst 403 through the pixel electrode 504.

In the flat panel X-ray detector of the construction described above, a fluorescent light is emitted in every direction from the phosphor layer 604 upon irradiation with the X-ray. The fluorescent light thus emitted is scattered and reflected from the reflective layer 605. It follows that it is highly possible for the fluorescent light emitted from the phosphor layer 604 in a certain pixel to arrive at the photo-conduction film 402 of the adjacent pixel. It should be noted that voltage is applied to the photo-conduction film 402 and, thus, the electric charge converted from the fluorescent light is scarcely scattered so as to arrive at the pixel electrode 504 corresponding to the particular region. Also, there is a problem that the light emitted from the phosphor is attenuated by the absorption within the phosphor film and by the reflection from the upper surface and the bottom surface of the film so as to lower the efficiency.

As a result, the fluorescent light emitted from the phosphor layer 604 is scattered so as to arrive at the adjacent pixel. The fluorescent light is converted into an electric charge in the photo-conduction film 402 of the adjacent pixel, and the electric charge thus generated is accumulated in the pixel electrode 504 of the adjacent pixel. It follows that a problem is generated that the resolution is deteriorated.

BRIEF SUMMARY OF THE INVENTION

An object of the present invention is to provide a flat panel X-ray detector, which has a high resolution and permits manufacturing a large apparatus with a low cost.

According to the present invention, there is provided a flat panel X-ray detector, comprising an X-ray-electric charge conversion film converting an incident X-ray into an electric charge, a pixel electrode contiguous to the X-ray-electric charge conversion film and arranged for every pixel, a switching element connected to the pixel electrode, a signal line connected to the switching element, and a scanning line supplying a driving signal to the switching element, wherein the X-ray-electric charge conversion film contains phosphor particles, a photosensitive material, and a carrier transfer material.

According to the present invention, there is provided an X-ray-electric charge conversion film, containing a photosensitive material, phosphor particles covered with the photosensitive material, and a carrier transfer material.

DETAILED DESCRIPTION OF THE INVENTION

A flat panel X-ray detector of the present invention comprises an X-ray-electric charge conversion film and is featured in that the X-ray-electric charge conversion film contains phosphor particles, a photosensitive material, and a carrier transfer material.

In the present invention, it is possible for the phosphor particles to be covered with the photosensitive material. Alternatively, it is possible for the phosphor particles to be dispersed in the X-ray-electric charge conversion film containing a photosensitive material and a carrier transfer material.

It is desirable for the phosphor particle used in the present invention to contain at least one material selected from the group consisting of a metal oxide, a metal iodide, and a metal sulfide. Also, it is desirable for the photosensitive material used in the present invention to contain at least one material of a first group consisting of trinitrofluorenone (TNF), diphenyl hydrazone, tris(8-quinolinolato)aluminum ($Alq_3$), and oxytitanium, and at least one material of a second group consisting of an azo pigment, a squarylium pigment, a phthalocyanine pigment, a titanyl phthalocyanine pigment, and a perylene pigment.

Further, it is desirable for the carrier transfer material used in the present invention to be at least one material selected from the group consisting of triphenylene, polyvinyl carbazole, N,N-diphenyl-N,N-di(m-tolyl)benzidine, poly (para-phenylene vinylene), polyalkyl thiophene, 4-(dicyano methylene)-2-methyl-6-(p-dimethylamino styryl)-4H-pyrane, and pentacene.

It is possible for the phosphor particles to contain a plurality of kinds of particles differing from each other in the particle diameter. In this case, it is desirable for the particle of the smaller diameter to have a particle diameter about 0.1 to 0.3 times as much as the particle diameter of the particle having a larger diameter.

It is possible for each pixel to include a capacitor accumulating the electric charge generated in the X-ray-electric charge conversion film and connected to the switching element in each pixel.

The phosphor used in the present invention represents a material that emits an ultraviolet light, a visible light and an infrared light upon irradiation with an X-ray. The photosensitive material used in the present invention represents a material that generates a carrier such as electrons and holes upon irradiation with an ultraviolet light, a visible light or an infrared light. Further, the carrier transfer material used in the present invention represents a material that transfers the carrier such as electrons and holes.

Some embodiments of the present invention will now be described.

Figure 4:
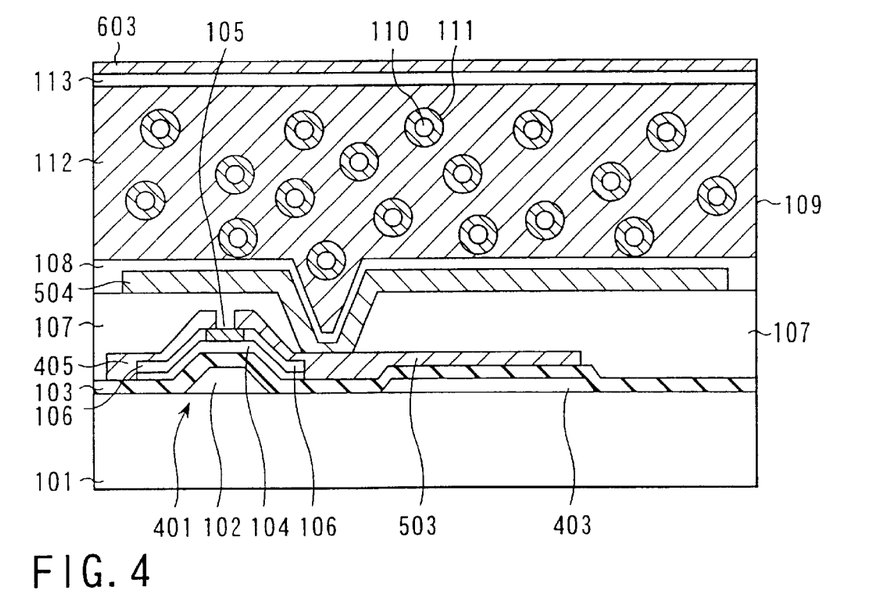
FIG. 4 is a cross sectional view showing a flat panel X-ray detector according to a first embodiment of the present invention.

The flat panel X-ray detector according to the first embodiment of the present invention has a circuit construction equal to that shown in FIG. 1 and has a pixel construction equal to that shown in FIG. 2. FIG. 4 is a cross sectional view showing the pixel used in the flat panel X-ray detector according to the first embodiment of the present invention. The flat panel X-ray detector of the first embodiment will now be described with reference to FIG. 4.

As shown in FIG. 4, a switching TFT 401, a Cst 403, an auxiliary electrode 503 facing the Cst 403, and a pixel electrode 503 electrically connected to the auxiliary electrode 503 are formed for each pixel on a glass substrate 101. Also, a hole transfer layer 108, an X-ray-electric charge conversion film 109, an electron transfer layer 113 and a common electrode 603 are uniformly formed in the order mentioned on the entire surface of the pixel electrode 504.

The switching TFT 401 comprises a gate electrode 102, an insulating film 103 for the gate insulation, and an undoped a-Si layer 104 used as an active layer. A stopper 105 and an $n^+$-type a-Si layer 106 are formed on the undoped a-Si layer 104. A source-drain electrode connected to the signal line 405 is formed on one part of the $n^+$-type a-Si layer 106, and a drain electrode connected to the auxiliary electrode 503 is formed on the other part of the $n^+$-type a-Si layer 106. Further, the X-ray-electric charge conversion film 109 used in this embodiment comprises phosphor particles 110 each covered with a photosensitive material 111 and a carrier transfer material 112.

How to manufacture the flat panel x-ray detector of the first embodiment will now be described.

In the first step, a predetermined material such as MoTa, Ta, TaN, Al alloy, Cu, MoW, or Ta/TaNx is deposited on the glass substrate 101 in a thickness of about 300 nm, followed by selectively etching the deposited layer so as to form a pattern including the gate electrode 102 of the switching TFT 401, a scanning line (not shown), the Cst 403, and a Cst line (not shown).

In the next step, the insulating film 103 is formed by depositing by a plasma CVD method a SiOx in a thickness of about 300 nm, followed by depositing by a plasma CVD method a SiNx on the SiOx layer in a thickness of about 50 nm. Then, the undoped a-Si layer 104 and a SiNx layer acting as the stopper 105 are deposited in a thickness of about 10 nm and about 200 nm, respectively.

Then, the stopper 105 is patterned by a back surface light exposure method to conform with the gate electrode 102, followed by depositing the n+-type a-Si layer 106 in a thickness of about 50 nm and subsequently etching selectively the undoped a-Si layer 104 and the n+-type a-Si layer 106 to conform with the shape of a transistor, thereby forming an a-Si island.

In the next step, those regions of the insulating film 103 which correspond to the contact portions both inside and outside the pixel area are selectively etched so as to form contact holes. Then, a laminate structure consisting of a Mo film about 50 nm thick, an Al film about 350 nm thick and a Mo film about 20 to about 50 nm thick is formed on the insulating film 103 by a sputtering method so as to form the auxiliary electrode 503, the signal line 405, and the other wirings.

Then, a SiNx layer is formed in a thickness of about 200 nm, followed by laminating a benzocyclobutene (BCB) layer on the SiNx layer in a thickness of about 1 to 5 μm, preferably about 3 μm, so as to form a protective film 107. After a contact hole is formed in the protective film 107, an ITO film is formed in a thickness of about 100 nm, followed by patterning the ITO film so as to form a pixel electrode 504 connected to the switching TFT 401 and to the auxiliary electrode 503. Further, the pixel electrode 504 is coated with diphenyl-3-methylphenyl-biphenyl-diamine (TPD) in a thickness of about 10 nm to about 100 μm so as to form the hole transfer layer 108.

In the next step, the hole transfer layer 108 is coated with the X-ray-electric charge conversion film 109 in a thickness of about 200 μm. For forming the X-ray-electric charge conversion film 109, phosphor particles each having a particle diameter of about 10 μm are prepared by using GdO$_2$S:Pr (GOS). Then, the surface of the phosphor particle is coated with the photosensitive material 111 prepared by mixing about 40% by weight of diphenyl hydrazone in polycarbonate. The coated phosphor particles are mixed with the carrier transfer material 112 formed of polyvinyl carbazole (PVK), and the surface of the hole transfer layer 108 is coated with the resultant mixture so as to form the X-ray-electric charge conversion layer 109.

It is possible to prepare the phosphor particles 110 by pulverizing and classifying a polycrystalline phosphor or by using a plasma melt vapor deposition. As a method of coating the phosphor particle 110 with the photosensitive material 111, it is possible to dip the phosphor particles 110 in a solution of the photosensitive material 111, followed by removing the solvent by evaporation.

It is desirable for the particle diameter of the phosphor particles to fall within a range of between 0.5 and 100 μm, preferably between 1 and 30 μm. It should be noted that the light emitting efficiency is lowered by the surface defect in the surface region of the phosphor particle. Also, the X-ray absorption efficiency is lowered by the decrease in the packing density of the phosphor particles in the X-ray-electric charge conversion film. It is necessary to determine the optimum particle diameter of the phosphor particles in view of these two factors.

It is necessary to determine the thickness of the photosensitive layer 111 covering the surface of the phosphor particle 110 such that the photosensitive layer 111 is capable of sufficiently absorbing the fluorescent light emitted from the phosphor particle. To be more specific, it is desirable for the thickness of the photosensitive layer 111 to fall within a range of between about 1 μm and about 10 μm.

The X-ray-electric charge conversion film 109 is coated with an oxazole derivative in a thickness of about 10 nm to about 100 nm so as to form the electron transfer layer 113. Further, the common electrode 603 is formed by film-forming, for example, an Al or MgAg film in a thickness of about 100 μm on the electron transfer layer 113, followed by connecting the common electrode 603 to the driving circuit, thereby finishing manufacture of the flat panel X-ray detector according to the first embodiment of the present invention.

Figure 5:
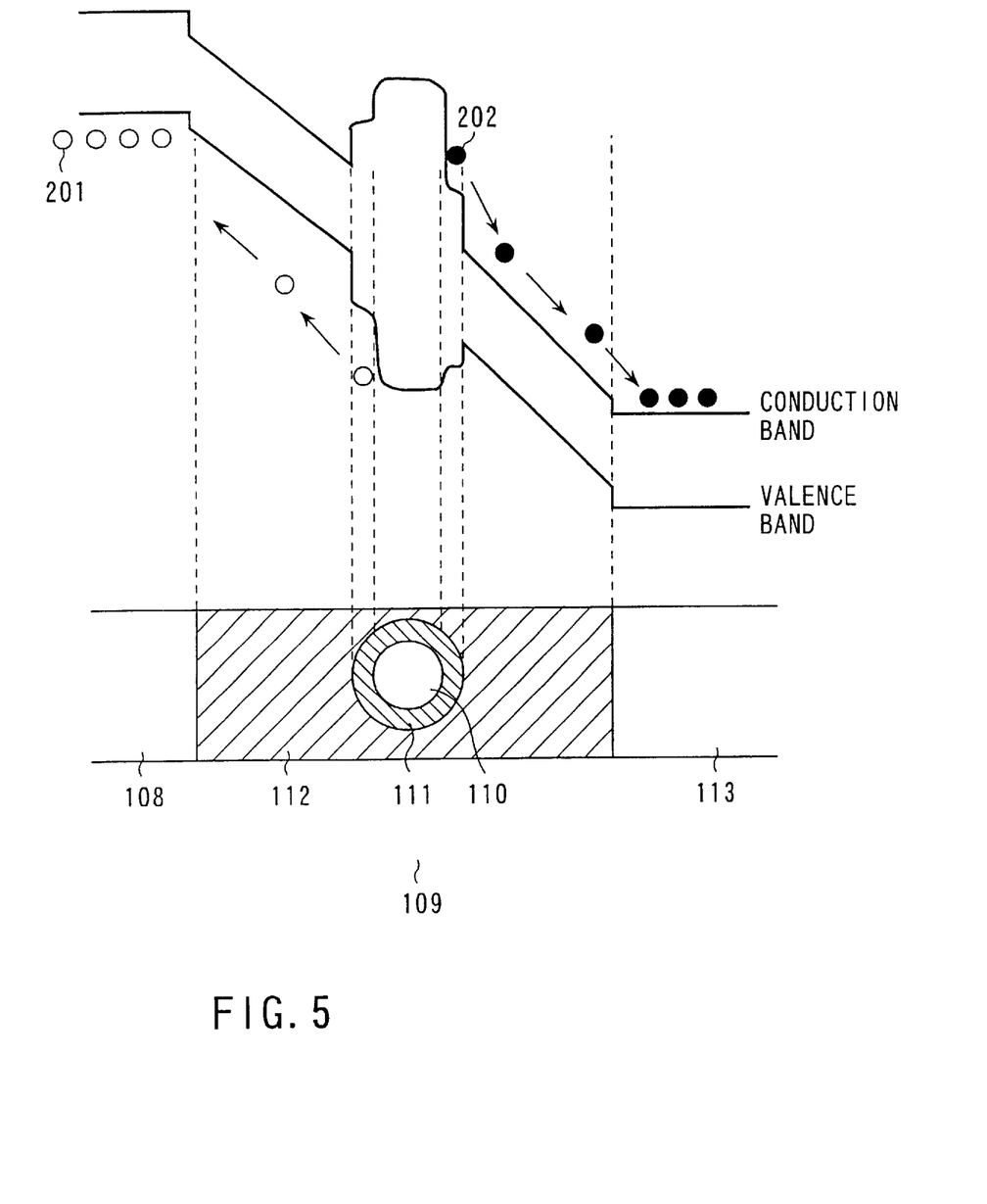
FIG. 5 is a band view of a flat panel X-ray detector according to the first embodiment of the present invention.

FIG. 5 is a band diagram of the flat panel X-ray detector according to the first embodiment of the present invention. The drawing shows only the portions of the hole transfer layer 108, the X-ray-electric charge conversion film 109 including the phosphor particles 110, the photosensitive material 111, and the carrier transfer material 112, and the electron transfer layer 113. Upon irradiation with the X-ray, the phosphor particle 110 contained in the X-ray-electric charge conversion film 109 shown in FIG. 5 emits a fluorescent light, and upon irradiation with the fluorescent light, the photosensitive material 111 covering the phosphor particle 110 generates carriers. The carriers thus generated are migrated within the carrier transfer material 112 such that holes 201 and electrons 202 are transferred into the hole transfer layer 108 and the electron transfer layer 113, respectively, with the result that the electric charges are accumulated in the pixel electrode.

As shown in FIG. 5, the band energy of the photosensitive material 111 is made higher than that in the portion of the carrier transfer material 112 on the side of the conduction band and is made lower than that in the portion of the carrier transfer material 112 on the side of the valence band. It should be noted that, since the carrier migration is carried out mainly within the carrier transfer material 112, the carriers generated within the photosensitive material 111 are migrated promptly into the carrier transfer material 112, leading to the situation described above. It should also be noted that the phosphor particle 110 has in general a band gap not smaller than about 3 eV, and each of the photosensitive material 111 and the carrier transfer material 112 has a band gap smaller than that of the phosphor particle 110. Incidentally, FIG. 5 shows that the X-ray-electric charge conversion film 109 contains only one phosphor particle 110 covered with the photosensitive material 111. However, the X-ray-electric charge conversion film 109 actually contains a large number of phosphor particles 110 covered with the photosensitive material 111.

In the first embodiment of the present invention, the phosphor particle 110 is covered with the photosensitive material 111. Therefore, when a fluorescent light is emitted from the phosphor particle 110 upon irradiation with the X-ray, the fluorescent light is incident on the photosensitive material 111 before the fluorescent light is scattered so as to generate electric charges. The electric charges thus generated are migrated within the carrier transfer material 112 to which an electric field is applied, with the result that the electric charges are not scattered but are accumulated in the pixel electrode 504 of each pixel 501.

It should be noted that, in the conventional flat panel X-ray detector, the fluorescent light generated within the phosphor layer upon irradiation with an X-ray is scattered, and the fluorescent light is incident on the adjacent pixel, and then the fluorescent light is converted into electric charges. As a result, the electric charges are accumulated in a certain pixel and adjacent pixels, giving rise to the problem that the resolution is rendered poor. However, according to the flat panel x-ray detector according to the first embodiment of the present invention, after the X-ray is converted into a fluorescent light in the phosphor particle 110, the fluorescent light is not scattered so as to be incident as it is on the photosensitive material 111 so as to generate the electric charges. Then, since an electric field is applied to the carrier transfer material 112, the electric charges are not scattered but are accumulated in the pixel 501 corresponding to the particular region so as to obtain a high resolution.

Also, in the prior art, it is necessary to form each of the photo-conduction film and the phosphor layer by vapor deposition or CVD method. However, in the flat panel X-ray detector according to the first embodiment of the present invention, the X-ray-electric charge conversion film 109 performs the functions which are conventionally performed by the two layers, the photo-conduction film and phosphor layer, in single layer. In addition, the X-ray-electric charge conversion film 109 can be formed easily, because the film 109 can be formed by the coating of the carrier transfer material 112 containing the phosphor particles 110 covered with the photosensitive material 111. Since the X-ray-electric charge conversion film 109 can be formed easily, a large flat panel X-ray detector can be obtained with a low manufacturing cost.

Figure 6:
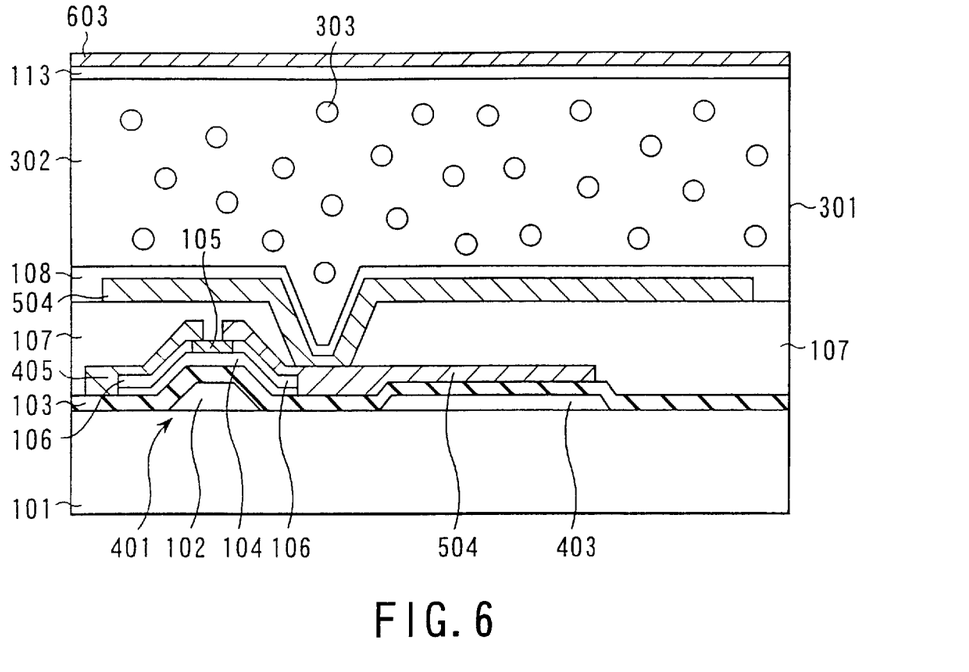
FIG. 6 is a cross sectional view showing a flat panel X-ray detector according to a second embodiment of the present invention.

A second embodiment of the present invention will now be described. The circuit construction of the flat panel X-ray detector according to the second embodiment of the present invention is equal to that shown in FIG. 1, and the pixel construction of the flat panel X-ray detector of the second embodiment is equal to that shown in FIG. 2. FIG. 6 is a cross sectional view of the pixel of the flat panel X-ray detector according to the second embodiment of the present invention. The flat panel X-ray detector according to the second embodiment of the present invention will now be described with reference to FIG. 6. The flat panel X-ray detector according to the second embodiment comprises an X-ray-electric charge conversion film 301, which differs from the X-ray-electric charge conversion film included in the X-ray detector according to the first embodiment. The X-ray-electric charge conversion film 301 in the second embodiment comprises phosphor particles 303 and a photosensitive-transfer material 302, which is photosensitive and has carrier transfer property.

How to manufacture the flat panel X-ray detector according to the second embodiment of the present invention will now be described. The second embodiment will be described mainly in respect of the portion differing from the first embodiment, and the same reference numerals are put in the drawing to the portions equal to the first embodiment for avoiding the overlapping description.

In the second embodiment, the process ranging between the step of forming the gate electrode 102 of the switching TFT 401, the scanning line, the Cst 403 and the Cst line on the glass substrate 101 and the step of forming the hole transfer layer 108 is carried out by employing the methods and the materials equal to those employed in the first embodiment.

In the next step, the X-ray-electric charge conversion film 301 is formed on the hole transfer layer 108 in a thickness of about 100 μm to about 300 μm. The X-ray-electric charge conversion film 301 is formed by coating the hole transfer layer 108 with a mixture of phosphor particles 303 in the photosensitive-transfer material 302 prepared by mixing about 50% by weight of TNF used as a photosensitive material and about 50% by weight of PVK used as a transfer material. The phosphor particles 303 are formed to have about 1 μm to about 30 μm of the particle diameter by using the material and the method used in the first embodiment. In the second embodiment, however, the surface of the phosphor particle 303 is not covered with the photosensitive material.

After formation of the x-ray-electric charge conversion film 301, the electron transfer layer 113 and the common electrode 603 are formed by the materials and methods equal to those employed in the first embodiment. Finally, the common electrode 603 is connected to the driving circuit so as to finish manufacture of the flat panel X-ray detector according to the second embodiment of the present invention.

In the second embodiment, the phosphor particle 303 is covered with the photosensitive material. However, since the phosphor particles 303 are surrounded by the photosensitive-transfer material 302, it is possible to obtain the effect similar to that obtained in the first embodiment. To be more specific, the fluorescent light emitted from the phosphor particle 303 after irradiation with an X-ray is converted into the electric charge by the photosensitive-transfer material 302 before the fluorescent light is scattered to the adjacent pixels. As a result, the electric charge finally obtained from the X-ray incident on a certain pixel does not leak into the adjacent pixel and is accumulated in the particular pixel, with the result that it is possible to obtain a high resolution.

It should be noted that an electric field is applied to the X-ray-electric charge conversion film 301. Therefore, after the fluorescent light is converted into an electric charge by the photosensitive-transfer material 302, the electric charge is attracted to the pixel electrode of the pixel corresponding to the particular region. It follows that the resolution is scarcely lowered.

What should also be noted is that, in the second embodiment, the X-ray-electric charge conversion film can be formed by the coating as in the first embodiment so as to simplify the forming method of the X-ray-electric charge conversion film. As a result, a large flat panel X-ray detector can be manufactured with a low manufacturing cost. Incidentally, in the second embodiment, the X-ray-electric charge conversion film 301 can be formed by only the coating of a mixture of the phosphor particles 301 and the photosensitive-transfer material 302 containing both a photosensitive material and a transfer material. Since the phosphor particle is not covered with a photosensitive material in the second embodiment, the X-ray-electric charge conversion film 301 can be formed more easily than in the first embodiment.

Figure 7:
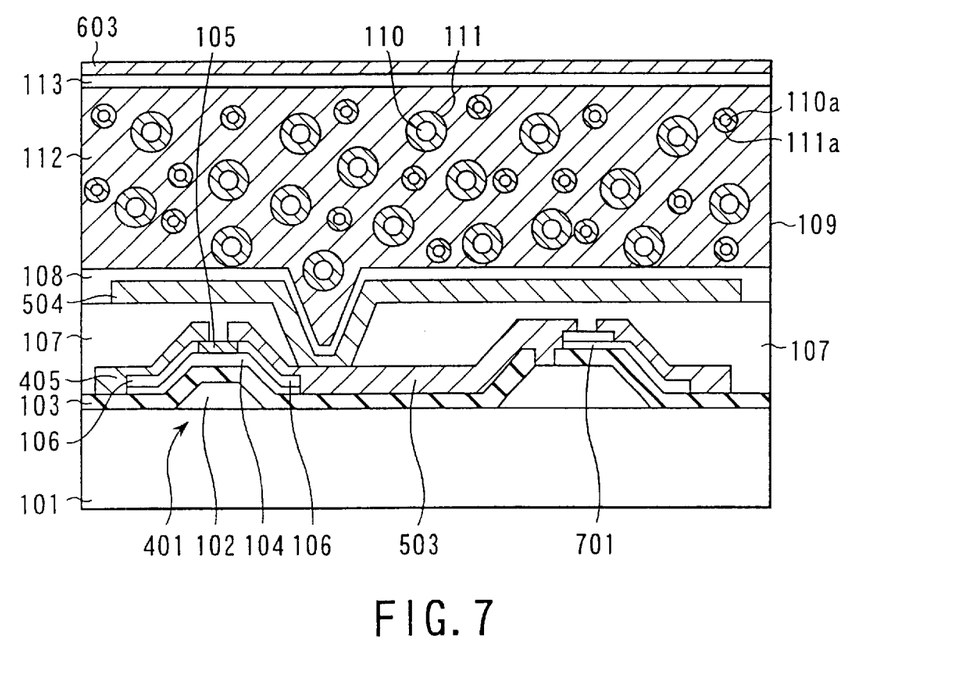
FIG. 7 is a cross sectional view showing a flat panel X-ray detector according to a third embodiment of the present invention.

A third embodiment of the present invention will now be described. The circuit construction of the flat panel X-ray detector according to the third embodiment of the present invention is equal to that shown in FIG. 1, and the pixel construction of the flat panel X-ray detector of the third embodiment is equal to that shown in FIG. 2. FIG. 7 is a cross sectional view of the pixel of the flat panel X-ray detector according to the third embodiment of the present invention. The flat panel X-ray detector according to the third embodiment of the present invention will now be described with reference to FIG. 7. The flat panel X-ray detector according to the third embodiment comprises an X-ray-electric charge conversion film 109, which differs from the X-ray-electric charge conversion film included in the X-ray detector according to the first embodiment.

In the third embodiment of the present invention, phosphor particles 110a having a relatively small particle diameter are mixed in the X-ray-electric charge conversion film 109 in addition to the phosphor particles 110 having a relatively large particle diameter, which are used in the first embodiment. The surface of the phosphor particle 110a having a relative small particle diameter is also covered with a photosensitive material 111a.

In the case of using the small particles 110a together with the large particles 110, it is possible to further increase the packing density of the phosphor particles in the X-ray-electric charge conversion film 109 so as to improve the absorption efficiency of the X-ray and to decrease the thickness of the X-ray-electric charge conversion film 109. As a result, it is possible to increase the intensity of the electric field applied to the X-ray-electric charge conversion film 109 so as to increase the mobility of the carriers generated in the X-ray-electric charge conversion film and, thus, to take out efficiently the carriers. Thus, it is possible to diminish the voltage applied to the X-ray-electric charge conversion film 109.

It is desirable for the particle diameter of the smaller phosphor particle 110a to be about 0.1 to 0.3 times as large as the particle diameter of the larger phosphor particle 110 because the packing density of the phosphor particles can be improved in this case. In the third embodiment of the present invention, arranged is a protective diode 701 serving to release the electric charge when the potential of the pixel electrode is elevated by the high voltage of the electrode in the upper portion of the photosensitive film so as to prevent the pixel potential from exceeding the breakdown voltage of the gate insulating film of the switching TFT.

It is possible to change the kinds of the large particle of the X-ray sensitive material and the small particle of the X-ray sensitive material depending on the purpose. For example, it is possible to obtain an X-ray-electric charge conversion film having a high mechanical strength and a high conversion efficiency by mixing large diameter phosphor particles of $Gd_2O_2S:Tb$ having a high mechanical strength and a high light emission efficiency with small diameter phosphor particles of CsI having a high absorption coefficient and a high conversion efficiency.

In the conventional laminate structure consisting of a phosphor film and a photosensitive film, the fluorescent light is absorbed within the phosphor or is reflected from the upper surface and the bottom surface of the phosphor film, with the result that the fluorescent light is attenuated. In the third embodiment of the present invention, however, the phosphor particles are covered with the photosensitive film so as to prevent the fluorescent from being attenuated and, thus, to improve the utilization rate of the fluorescent light.

The present invention is not limited to the various embodiments described above.

For example, it is possible to use any kind of phosphor as far as the phosphor emits a fluorescent light of an ultraviolet light, a visible light and an infrared light upon irradiation with an X-ray. For example, a metal oxide, a metal iodide and a metal sulfide exhibits a large absorption coefficient of an X-ray and, thus, the X-ray can be absorbed sufficiently by a thin film of any of these materials, though the phosphor used in the present invention is not limited to these materials. Particularly, it is desirable to use, for example, GOS, $GdO_2S:Tb$, CsI, ZnS, $YxGd_{1-2x}O_3$, or $CdWO_4$ as the phosphor because these materials exhibit a large X-ray absorption coefficient and, thus, the X-ray can be sufficiently absorbed by a thin film of these materials. In addition, the fluorescent light emission efficiency upon irradiation with an X-ray is particularly high.

It is desirable for the particle diameter of the phosphor particle to fall within a range of between about 1 $\mu$m and about 100 $\mu$m, particularly, to be about 10 $\mu$m. If the particle diameter is smaller than about 1 $\mu$m, the surface defects such as the surface state may be increased so as to lower the light emitting efficiency. On the other hand, if the particle diameter exceeds about 100 $\mu$m, it may be difficult to mix sufficiently the phosphor particles with the other materials forming the X-ray-electric charge conversion film for formation of the X-ray-electric charge conversion film by coating.

It is also desirable for the phosphor particle used in the present invention to be shaped substantially spherical because the thickness of the X-ray-electric charge conversion film is likely to be made uniform.

Further, the equivalent thickness of the phosphor in the X-ray-electric charge conversion film is selected depending on the X-ray absorption coefficient of the phosphor material. To be more specific, it is desirable for the equivalent thickness of the phosphor to fall within a range of between about 1 and about 10 times the thickness at which the phosphor absorbs at least about 50% of the X-ray. The phosphor having an equivalent thickness of this level is capable of sufficiently absorbing the X-ray. It is also desirable for the thickness of the X-ray-electric charge conversion film to fall within a range of between about 1.3 and about 3 times the equivalent thickness noted above. Where the thickness of the X-ray-electric charge conversion film falls within the range noted above, it is possible to ensure a sufficient fluidity required for forming the X-ray-electric charge conversion film by means of coating.

The photosensitive material used in the flat panel X-ray detector of the present invention, which generates carriers such as holes and electrons upon irradiation with light such as an ultraviolet light, a visible light or an infrared light, comprises at least one material of a first group consisting of trinitrofluorenone (TNF), diphenyl hydrazone, tris (8-quinolilato) aluminum (Alq), and oxytitanium. It is also possible for the photosensitive material to comprise at least one material of a second group consisting of an azo pigment, a squalylium pigment, a phthalocyanine pigment, a titanyl phthalocyanine and a perylene pigment together with at least one material of the first group. However, the photosensitive material used in the present invention is not limited to the materials exemplified above.

It is desirable for the X-ray-electric charge conversion film to contain the photosensitive material in an amount falling within a range of between about 0.1 mol % and about 40 mol %. If the amount of the photosensitive material contained in the X-ray-electric charge conversion film is smaller than about 0.1 mol %, the sensitivity as the photosensitive material may be lowered. Also, the absorption coefficient of the fluorescent light tends to be lowered. On the other hand, if the amount of the photosensitive material is larger than about 40 mol %, it is possible for the amount of the carrier transfer material to be rendered insufficient so as to deteriorate the carrier transfer characteristics.

Where the phosphor particle is covered with the photosensitive material, it is desirable for the thickness of the photosensitive layer to fall within a range of between about 1 μm and about 100 μm. If the thickness of the photosensitive material layer is less than about 1 μm, it may be difficult for the phosphor particle to be coated uniformly with the photosensitive material. Also, the absorption of the fluorescent light may be rendered insufficient. On the other hand, if the thickness of the photosensitive layer exceeds about 100 μm, it is possible for the photosensitive material to be mixed with the carrier transfer material and for the coated photosensitive layer to be rendered nonuniform in thickness.

It is desirable for the photosensitive material used in the present invention to be selected from the group consisting of the azo-series pigment such as 4,4'(9-oxo-9H-fluorene-2,7-diyl) bis-(azo)-bis [N-(2-chlorophenyl)-3-hydroxy-2-naphthalene carboxyamide] and the trisazo pigment such as tris {4,[3-(2-ethylphenyl carbamoyl)-2-hydroxybenzo]-1-ylazo] phenyl} amine.

A material capable of transferring the carrier such as electrons and holes can be used in the present invention as the carrier transfer material. To be more specific, the carrier transfer material used in the present invention includes compounds in which at least one element selected from the group consisting of hydrogen, oxygen and nitrogen is bonded to carbon or silicon. Particularly, it is desirable to use metal complexes of these compounds because these metal complexes exhibit a high carrier mobility, though the carrier transfer material used in the present invention is not limited to the materials exemplified above.

Among the materials exemplified above, it is desirable to use polyvinyl carbazole (PVK), N,N-diphenyl-N,N-di (m-tolyl) benzidine (TPD), poly-para-phenylene vinylene (PPV), polyalkyl thiophene, 4-(dicyanomethylene)-2-methyl-6-(p-dimethylamino styryl)-4H-pyran (DCM), pentacene, NPD, polyphenylene vinylene, polyalkyl thiophene and liquid crystal molecules. Particularly, it is more desirable to use a naphthalene series organic liquid crystal material and 4-N,N-bis(4-methylphenyl)amino-α-phenyl-sitylben because these materials exhibit a high carrier mobility. It is also possible to mix these organic materials with a polymer such as polycarbonate.

Also, it is desirable for the carrier transfer material to exhibit a carrier mobility not lower than about $1 \times 10^{-7}$ cm$^2$/(V·s) in order to obtain a sufficient conductivity and, to have a resistivity not lower than about $1 \times 10^{10}$ Ωcm in order to prevent an increase of the dark current.

It is desirable for each of the electron transfer layer and the hole transfer layer to exhibit a carrier mobility not lower than about $1 \times 10^{-7}$ cm$^2$/(V·s) in order to obtain a sufficient conductivity, and to have a resistivity not lower than about $1 \times 10^8$ Ωcm in order to prevent an increase of the dark current.

In the flat panel X-ray detector of the present invention, it is possible to use at least one material selected from the group consisting of an oxazoazole derivative, Alq$_3$, n-type Si, and n-type GaAs for forming the electron transfer layer. These materials produce the effect of a high electron mobility.

It is possible to use at least one material selected from the group consisting of TPD, diamine, p-type Si and p-type GaAs for forming the hole transfer layer. These materials produce the effect of a high hole mobility.

In the present invention, it is possible to use any kind of the substrate as far as a TFT can be formed on the substrate.

In each of the embodiments described previously, the X-ray-electric charge conversion film is formed at low temperatures by means of coating. Therefore, it is possible to use a plastic material having a low heat resistance for forming the substrate. In this case, the entire flat panel X-ray detector can be made flexible. In the case of using a plastic substrate, the flat panel x-ray detector can be made light in weight so as to facilitate the transportation of the flat panel X-ray detector.

In each of the embodiments described previously, a-Si was used as the silicon for forming a TFT. Alternatively, it is also possible to use a polycrystalline silicon (polysilicon) for forming the TFT. In the case of using a polysilicon for forming the TFT, the TFT can be made small so as to enlarge the effective area of the pixel. Also, the peripheral circuit can also be formed on the same glass substrate, leading to a low manufacturing cost including the peripheral circuit.

The TFT can be of a top gate type or bottom gate type.

Further, the protective film 107 can be formed of, for example, an inorganic SiNx or SiO$_2$, organic polyimides (∈=about 3.3; breakdown voltage of about 300 V/mm), BCB (∈=about 2.7; breakdown voltage of about 400 V/mm), acrylic photosensitive resin HRC (∈=about 3.2) manufactured by JSR Inc., and a black resist. It is also possible to laminate films of these materials one upon the other. Also, a fluorine-based resin has a small dielectric constant (∈=about 2.1) and, thus, can be used effectively for forming the protective film 107. It is not absolutely necessary for the protective film 107 to be photosensitive. However, a photosensitive material is effective because the patterning can be facilitated.

As described above, the present invention provides a flat panel X-ray detector having a high resolution, which can be formed as a large flat panel X-ray detector with a low manufacturing cost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A planar X-ray detector, comprising:
    an X-ray-electric charge conversion film converting an incident X-ray into an electric charge;
    a pixel electrode contiguous to said X-ray-electric charge conversion film and arranged for every pixel;
    a switching element connected to said pixel electrode;
    a signal line connected to said switching element; and
    a scanning line supplying a driving signal to said switching element,
    wherein said X-ray-electric charge conversion film contains phosphor particles, each of which is covered with a photosensitive material, and is dispersed in a carrier transfer material.

2. The planar X-ray detector according to claim 1, wherein a thickness of said photosensitive material covering said phosphor particle falls within a range of between about 1 μm and about 10 μm.

3. The planar X-ray detector according to claim 1, wherein said phosphor particles have a diameter falling within a range of between 0.5 μm and 100 μm.

4. The planar X-ray detector according to claim 1, wherein said phosphor particles contain at least one material selected from the group consisting of a metal oxide, a metal iodide and a metal sulfide.

5. The flat panel x-ray detector according to claim 1, wherein said photosensitive material contains at least one material of a first group consisting of trinitrofluorenone, diphenyl hydrazone, tris(8-quinolato)aluminum, and oxytitanium, or at least one material of a second group consisting of an azo pigment, a squalylium pigment, a phthalocyanine pigment, a titanyl phthalocyanine pigment and a perylene pigment together with at least one material of said first group.

6. The flat panel X-ray detector according to claim 1, wherein said carrier transfer material is at least one material selected from the group consisting of triphenylene, polyvinyl carbazole, N,N-diphenyl-N,N-di(m-tolyl)benzidine, poly-para-phenylene vinylene, polyalkyl thiophene, 4-(dicyanomethylene)-2-methyl-6-(p-dimethylamino styryl)-4H-pyrane, and pentacene.

7. The planar X-ray detector according to claim 1, wherein said phosphor particles comprise a plurality of phosphor particles differing from each other in particle diameter.

8. The planar X-ray detector according to claim 7, wherein a diameter of a phosphor particle having a smaller particle diameter is about 0.1 to about 0.3 times as large as a diameter of a phosphor particle having a larger particle diameter.

9. The flat panel X-ray detector according to claim 1, wherein each of said pixels includes a capacitor accumulating the electric charge generated in said X-ray-electric charge conversion film, and each capacitor is connected to a switching element in each pixel.

10. The flat panel X-ray detector according to claim 1, wherein a high voltage protective circuit is included in said pixel.

11. The planar X-ray detector according to claim 1, wherein said carrier transfer material is an organic compound.

12. The planar X-ray detector according to claim 1, further comprising at least one of a hole transfer layer on one surface of the X-ray-electric charge conversion film, and an electron transfer layer on another surface of the X-ray-electric charge conversion film.

13. An X-ray-electric charge conversion film, comprising:
phosphor particles, each of which is covered with a photosensitive material, and is dispersed in a carrier transfer material.

14. The X-ray-electric charge conversion film according to claim 13, wherein a thickness of said photosensitive material covering said phosphor particle falls within a range of between about 1 μm and about 10 μm.

15. The X-ray-electric charge conversion film according to claim 13, wherein said phosphor particles have a diameter falling within a range of between 0.5 μm and 100 μm.

16. The X-ray-electric charge conversion film according to claim 13, wherein said phosphor particles contain at least one material selected from the group consisting of a metal oxide, a metal iodide and a metal sulfide.

17. The X-ray-electric charge conversion film according to claim 13, wherein said photosensitive material contains at least one material of a first group consisting of trinitrofluorenone, diphenyl hydrazone, tris(8-quinolato) aluminum, and oxytitanium, or at least one material of a second group consisting of an azo pigment, a squalylium pigment, a phthalocyanine pigment, a titanyl phthalocyanine pigment and a perylene pigment together with at least one material of said first group.

18. The X-ray-electric charge conversion film according to claim 13, wherein said carrier transfer material is at least one material selected from the group consisting of triphenylene, polyvinyl carbazole, N,N-diphenyl-N,N-di(m-tolyl)benzidine, poly-para-phenylene vinylene, polyalkyl thiophene, 4-(dicyanomethylene)-2-methyl-6-(p-dimethylamino styryl)-4H-pyrane, and pentacene.

19. The X-ray-electric charge conversion film according to claim 13, wherein said phosphor particles comprise a plurality of phosphor particles differing from each other in particle diameter.

20. The X-ray-electric charge conversion film according to claim 19, wherein a diameter of a phosphor particle having a smaller particle diameter is about 0.1 to about 0.3 times as large as a diameter of a phosphor particle having a larger particle diameter.

21. The X-ray-electric charge conversion film according to claim 13, wherein said carrier transfer material is an organic compound.

22. The X-ray-electric charge conversion film according to claim 13, wherein a bandgap of the photosensitive material is larger than a bandgap of the carrier transfer material.

* * * * *